United States Patent [19]
Lin et al.

[11] Patent Number: 5,679,602
[45] Date of Patent: Oct. 21, 1997

[54] METHOD OF FORMING MOSFET DEVICES WITH HEAVILY DOPED LOCAL CHANNEL STOPS

[75] Inventors: Jengping Lin, Tao-Yuan; Sun-Chieh Chien, Hsin-Chu City, both of Taiwan

[73] Assignee: United Microelectronics Corporation, Hsin-Chu City, Taiwan

[21] Appl. No.: 716,730

[22] Filed: Sep. 23, 1996

Related U.S. Application Data

[60] Provisional application No. 60/010,732, Jan. 29, 1996.
[51] Int. Cl.$^6$ .................................................. H01L 21/76
[52] U.S. Cl. ............................. 437/70; 437/67; 437/26; 437/28; 437/72; 148/DIG. 50
[58] Field of Search .................. 437/67, 26, 28, 437/72, 70; 148/DIG. 50

[56] References Cited

U.S. PATENT DOCUMENTS

| | | | |
|---|---|---|---|
| 4,835,115 | 5/1989 | Eklund | 437/67 |
| 4,994,407 | 2/1991 | Custode et al. | 437/67 |
| 5,106,777 | 4/1992 | Rodder | 437/70 |
| 5,468,676 | 11/1995 | Madan | 437/67 |

FOREIGN PATENT DOCUMENTS

| | | | |
|---|---|---|---|
| 0283944 | 11/1989 | Japan | 437/70 |
| 0003246 | 1/1993 | Japan | 437/72 |

*Primary Examiner*—Trung Dang
*Attorney, Agent, or Firm*—William H. Wright

[57] ABSTRACT

Device isolation is provided for a MOSFET circuit by providing channel stop regions comprising a distribution of dopants localized beneath and adjacent to corresponding field oxide regions. Channel stop regions are not formed under the channel regions of the MOSFETs and are selectively formed under the narrower field oxide regions which are most likely to provide inadequate device isolation. The channel stop regions are formed subsequent to the formation of field oxide regions, beginning by forming polysilicon spacers so that the polysilicon spacers extend over the bird's beak regions of the field oxide regions. Next, a channel stop mask having openings over selected field oxide regions is formed. Trenches are etched near the center of the exposed field oxide regions, leaving approximately 500 Å of oxide on the bottom of the trench. Ions are implanted through the bottom of the trenches to form channel stop regions beneath the field oxide regions.

19 Claims, 5 Drawing Sheets

METHOD OF FORMING MOSFET DEVICES WITH HEAVILY DOPED LOCAL CHANNEL STOPS

This application claims priority from provisional application Ser. No. 60/010,732, filed Jan. 29, 1996.

BACKGROUND OF THE INVENTION

1. Field of the Invention

This invention relates to MOSFET semiconductor devices and, more particularly, to improved channel stop structures and method for the manufacture thereof.

2. Description of the Related Art

In most semiconductor devices, and particularly those incorporating MOS field effect transistors, active device regions are separated from adjacent active device regions by device isolation regions which include field oxide (FOX) regions. Channel stop implants act in conjunction with the field oxide regions to confine carriers within the active device regions. Typically, a channel stop implant is performed either before or after growth of the field oxide regions. An exemplary configuration of a MOS device active region having both field oxide regions and a channel stop implant to contain carriers is illustrated in FIG. 1. Semiconductor circuit 10 includes a MOS transistor 15 formed on a P-type substrate 11 having a gate oxide 12 and field oxide isolation regions 14 formed on the surface of the substrate 11. A doped polysilicon gate electrode 16 is formed over a channel region defined laterally by lightly doped regions 18 on either side of the channel. Oxide spacers 19 formed on either side of the gate electrode overlie the lightly doped regions 18, and heavily doped source and drain regions 20 and 22 are formed in a self-aligned manner with the spacers 19 and the field oxide regions 14. The P-type channel stop implant 24 (for the illustrated N-channel device) lies beneath the entire active device region, extending beneath the channel of the illustrated transistor and beneath the field oxide regions on either side of the active device region.

As the state of the art moves towards smaller and smaller devices with tighter and tighter specifications, the width of at least some of the field oxide isolation regions is scaled to less than 0.35 μm. Such narrow field oxide regions may provide inadequate device isolation, often making it necessary to enhance the device isolation provided by the field oxide regions 14 shown in FIG. 1. It is typically impractical to provide improved device isolation by forming deeper field oxide regions, at least using the LOCOS field oxide techniques, because of the unacceptable amount of lateral growth of "bird's beak" regions that accompanies the formation of thick field oxide regions. Increasingly heavy channel stop implants are therefore required to allow such smaller field oxide isolation regions to prevent carrier punch-through and to prevent the operation of parasitic field effect transistors which conduct carriers between adjacent active device regions. On the other hand, as the carrier concentration implanted as a channel stop increases, junction leakage and the body effect of the normal MOSFET devices are unacceptably degraded.

It is accordingly an object of the present invention to provide a device isolation region more compatible with reduced device geometries.

SUMMARY OF THE PREFERRED EMBODIMENTS

Preferred embodiments of the present invention provide a method of forming a semiconductor device including the steps of forming a field oxide masking layer over a semiconductor substrate and patterning the masking layer with field oxide openings therethrough. Field oxide regions are formed upon an upper surface of the semiconductor substrate including at least one short field oxide region. The method continues by forming a channel stop mask with a channel stop opening therethrough over a central region of the short field oxide region. A trench is etched in the short field oxide region through the channel stop opening in the channel stop mask and then dopant material is ion implanted through a bottom of the trench to form a channel stop in the substrate below the trench. The channel stop mask is stripped from the substrate and a semiconductor device is formed on or within the substrate.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

In accordance with this invention, a localized heavily doped channel stop 62' is placed under the central region of at least one of the field oxide regions 54' that provides device isolation for a MOS device. Most preferably, such a heavily doped channel stop 62' is only formed under the narrower of the field oxide regions formed on either side of an active device region. Embodiments of the present invention provide sufficient device isolation between adjacent active device regions in a manner which preferably does not compromise the operation of devices formed within the active device regions. In particularly preferred embodiments of the invention, heavy channel stop implantations are not formed under the active device regions, avoiding the junction leakage and body effect degradation associated with use of heavy channel stop implantations under active regions. In addition, aspects of the present invention allow thinner field oxide regions to be formed, reducing the lateral extent of bird's beak regions 64 (FIG. 2) typically formed in the LOCOS formation of field oxide regions.

Figure 1:
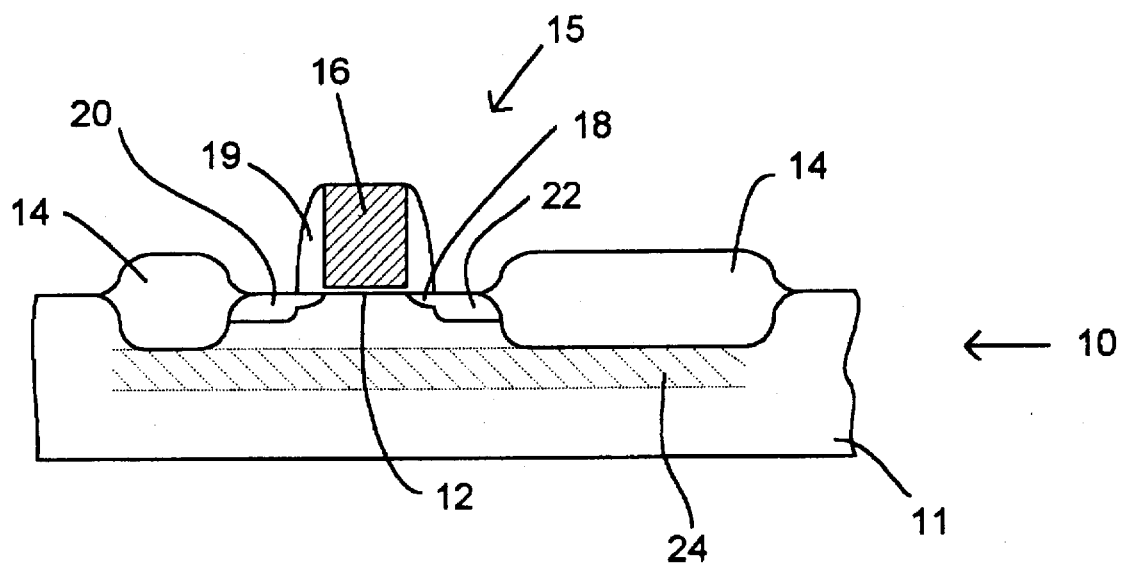
FIG. 1 illustrates a conventional semiconductor circuit including a MOS device, field oxide device isolation regions and a channel stop implantation lying under the MOS device and the field oxide regions.

FIG. 1 shows a semiconductor device with a MOS field effect transistor 35 formed on a substrate 31 having a gate oxide layer 32 and field oxidation regions 34, 54' on its surface. A doped polysilicon gate electrode 36 is formed on the gate oxide layer 32, oxide spacer elements are formed 39 on either side of the gate electrode 36, and lightly doped regions are formed self-aligned to the gate electrode 36 and beneath the spacers 39. Heavily doped source and drain regions 40, 42 extend from the lightly doped regions 38 to the field oxide regions 34 and 54'. A heavily doped P-type region 62' is formed under the field oxide region 54' as a channel stop for the illustrated device. By forming the localized channel stop region 62' under the field oxide region 54', the effectiveness of the relatively narrow field oxide region 54' is enhanced, providing improved device isolation between the MOS transistor 35 and an adjacent active device. In the illustrated embodiment, no channel stop region is provided under the relatively wide field oxide region 34, since that region may be made sufficiently wide so as to provide device isolation without a channel stop region. If, on the other hand, the field oxide region 34 is not sufficiently wide so as to provide an acceptable level of device isolation, then a localized channel stop region would also be formed under field oxide region 34. For the device illustrated in FIG. 2, no channel stop implantation is formed under the active device region, so that the channel stop implantation preferably does not affect the MOS transistor 35 formed in the active device region.

The present invention is generally applicable to MOS devices using device isolation regions. In particular, aspects of the present invention can be used with either P-channel MOS transistors or N-channel MOS transistors. While the following description is presented with specific reference to an N-channel device, the present invention can also be used with P-channel devices. Aspects of the present invention can also be used to advantage with MOS transistors formed within a P-type or N-type isolation well.

Figure 2:
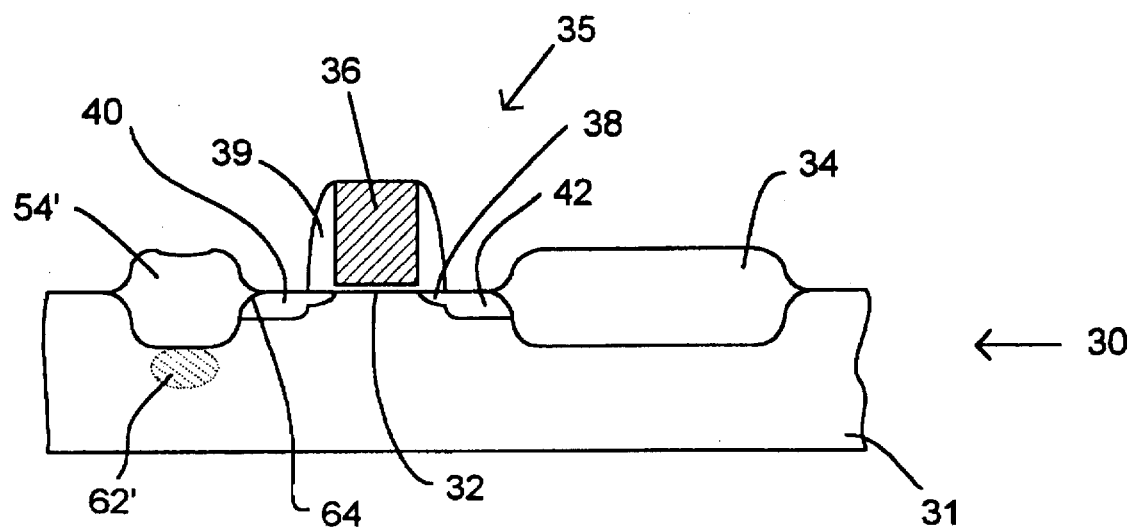
FIG. 2 schematically illustrates a semiconductor device having a localized channel stop implantation in accordance with the present invention.
Figure 3:
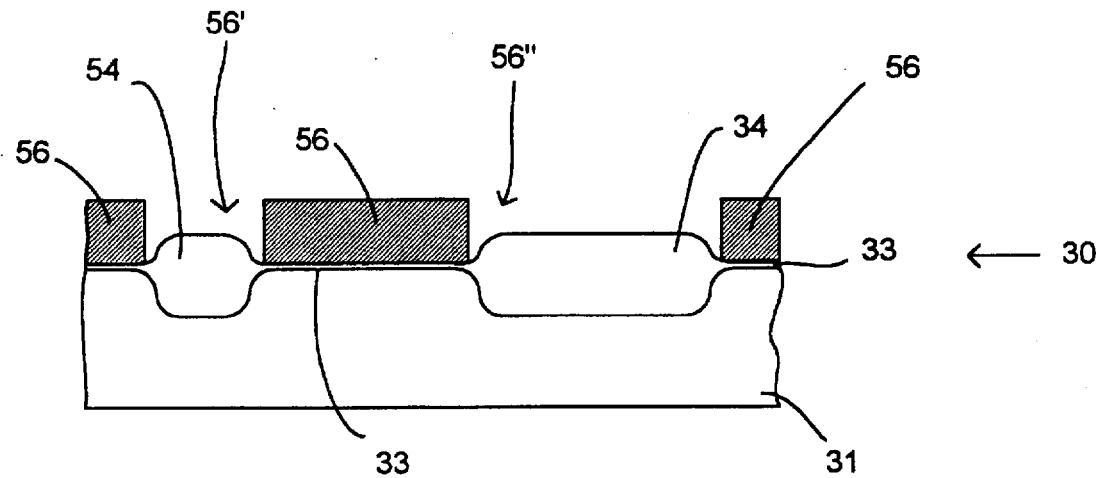
FIGS. 3–9 schematically illustrate a series of process steps for forming a semiconductor device in accordance with the present invention.
Figure 4:
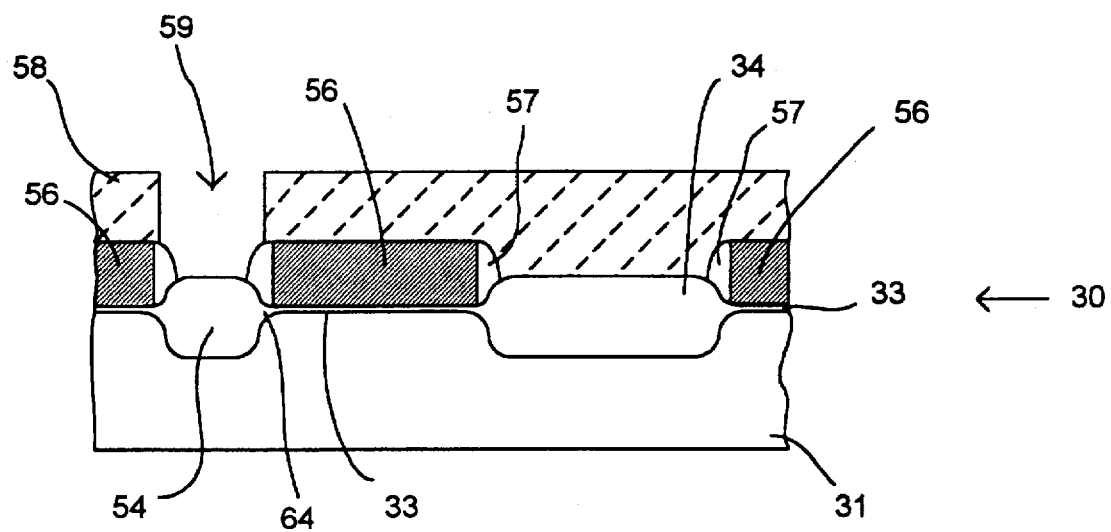

FIGS. 3-9 illustrate a process by which the semiconductor device of FIG. 2 may be formed. Referring to FIG. 3, a device 30 at an early stage of processing is illustrated. Pad oxide layer 33, preferably formed to a thickness of approximately 150 Å by thermal oxidation at about 900° C., extends over the surface of the P-type silicon substrate 31 to protect the substrate surface during processing. At the stage of processing illustrated by FIG. 3, field oxidation regions 34 and 54 have already been formed. Most often, these field oxidation regions 34, 54 are formed by a conventional LOCOS process. Briefly, a layer of silicon nitride (not illustrated) is deposited on the pad oxide layer 33, for example by low pressure chemical vapor deposition (LPCVD), and then the silicon nitride layer is patterned by photolithography and reactive ion etching (RIE). The remaining silicon nitride layer forms a mask 56 that exposes the surface of the substrate 31 or the pad oxide layer 33 over those regions where the field oxide regions are to be formed. Typically, the openings in the silicon nitride field oxidation mask 56 provide both narrow openings 56' through which narrow field oxide regions will be formed and wider openings 56" where wider field oxide regions will be formed. Wider field oxide regions are provided where design considerations allow sufficient substrate surface area for the formation of wider field oxide regions. Narrower mask openings 56' are formed above the substrate regions separating adjacent active device regions where design considerations require closer device spacings. The device 30 is then placed in a moist oxidizing environment, resulting in the growth of thick field oxide regions within the mask openings, with wider field oxide regions 34 formed within wider openings 56" and narrower field oxide regions 54 formed within the narrower openings 56'.

After the formation of field oxide regions 34 and 54, a layer of polysilicon is deposited by LPCVD to a thickness of about 1000 Å, covering the surface of the device and depositing within the openings in the field oxide mask. The polysilicon layer is then etched back using RIE to form polysilicon spacers 57 adjacent to the sidewalls of the openings 56' and 56" of silicon nitride field oxide mask 56 and above the bird's beak regions 64 of the field oxide regions 34 and 54. A photoresist channel stop mask 58 is then formed with a channel stop opening 59 above the shorter field oxide region 54, but covering the longer field oxide region 34 which is sufficiently long that no channel stop implant is required to provide adequate device isolation. The device 30 now has the structure schematically illustrated in FIG. 4.

Figure 5:
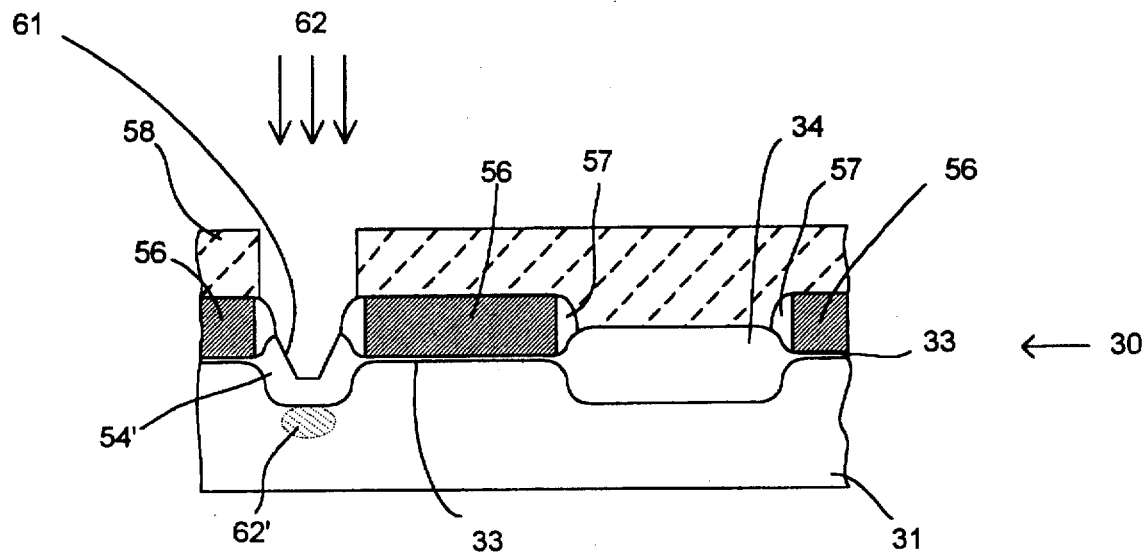

Referring now to FIG. 5, a trench 61 is etched into the surface of the shorter field oxide region 54' extending down toward the substrate 31 under the field oxide region 54'. The extent of the etch is controlled so that the thickness of the field oxide under the trench 61 is preferably less than approximately 1000 Å. Since the channel stop implant is to be performed through the trench 61, a thin oxide bottom is preferred because the thin oxide allows for more precise control of the implantation. Most preferably, the oxide at the bottom of the trench is about 500 Å thick. Still referring to FIG. 5, an implantation 62 of a channel stop dopant preferably is then performed through the opening in the photoresist mask 58 and through the bottom of trench 61. The dopant material 62 is preferably implanted at an energy such that at least a portion of the channel stop implant 62' is formed below the trench 61 adjacent to the bottom of the field oxide region 54'. A preferred implantation for an N-channel device may consist of boron or $BF_2$ implanted to a dose of between about $5 \times 10^{14}$ atoms/cm$^2$ and about $5 \times 10^{15}$ atoms/cm$^2$ at an energy of between about 50 KeV and 150 KeV and, most preferably, to a dose of about $5 \times 10^{15}$ atoms/cm$^2$ at an energy of about 100 KeV. For a P-channel device, a preferred implantation may consist of arsenic or phosphorus implanted to a dose of between about $5 \times 10^{14}$ atoms/cm$^2$ and about $5 \times 10^{15}$ atoms/cm$^2$ at an energy of between about 50 KeV and 150 KeV and, most preferably, to a dose of about $5 \times 10^{15}$ atoms/cm$^2$ at an energy of about 100 KeV.

Figure 6:
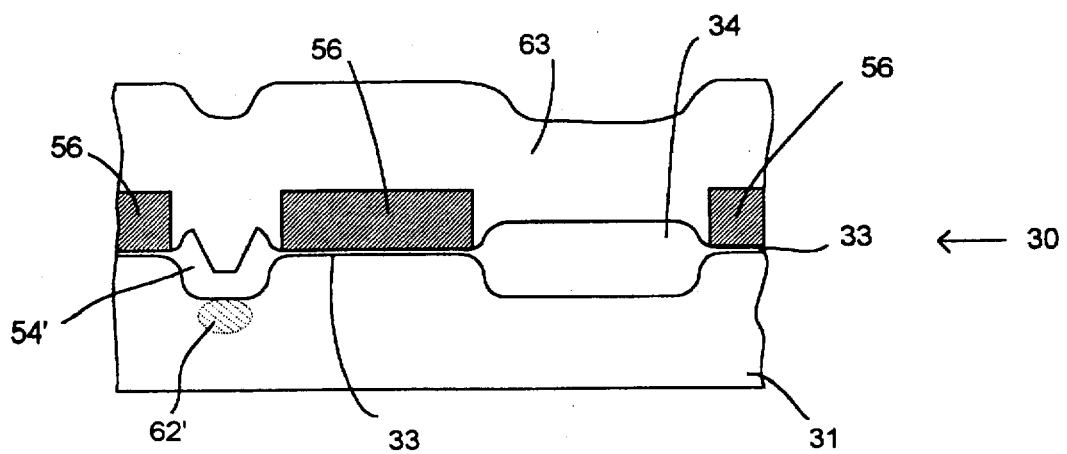
Figure 7:
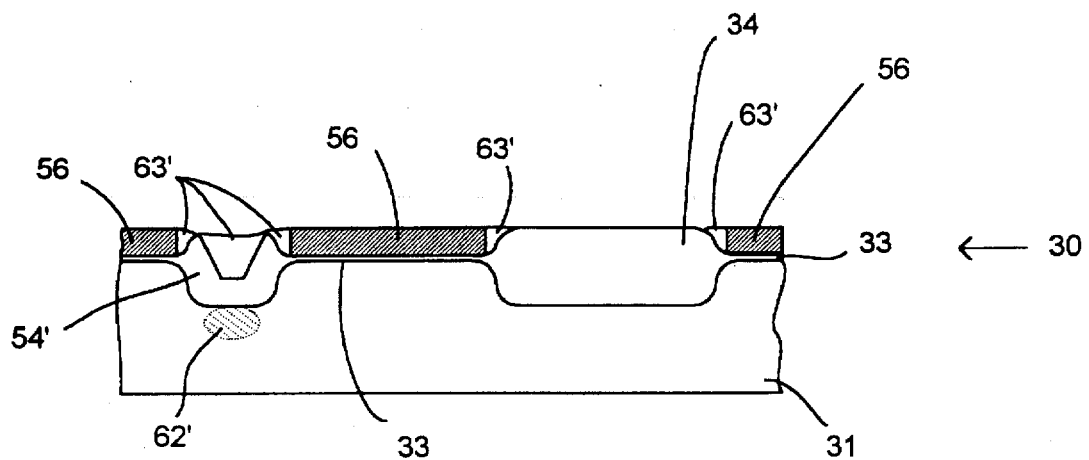
Figure 8:
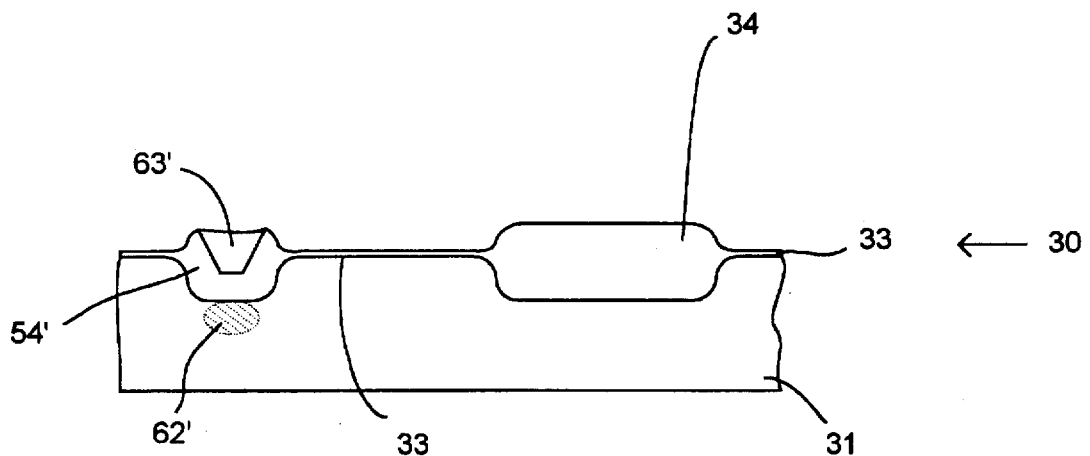

FIG. 6 shows the device 30 after the photoresist mask 58 has been stripped in the conventional manner and the polysilicon spacers 57 have been removed by wet etching using diluted nitric acid and HF as an etchant. A thick blanket of silicon oxide 63 is deposited by a CVD process to fill the trench 61 and the spaces where the polysilicon spacers 57 were removed within the openings in mask 56, thereby planarizing the device 30. To this end, the blanket oxide layer 63 is preferably deposited to a thickness greater than the thickness of the silicon nitride mask 56. Blanket oxide layer 63 is then etched back using either an RIE process or by chemical mechanical polishing (CMP) using the silicon nitride mask 56 as an etch stop. Typically, the silicon nitride mask is partially etched in this process. The resulting device has a substantially planar surface with portions 63' of the oxide layer 63 remaining in the trench and adjacent to the field oxide regions 34 and 54', as shown in FIG. 7. The remaining portions of the silicon nitride mask 56 are then stripped using an aqueous solution of hot phosphoric acid with a concentration of between about 85% and 95% at a temperature of between about 170° C. and about 190° C. for a time of between about 50 minutes and about 100 minutes. The resulting structure is shown in FIG. 8.

Figure 9:
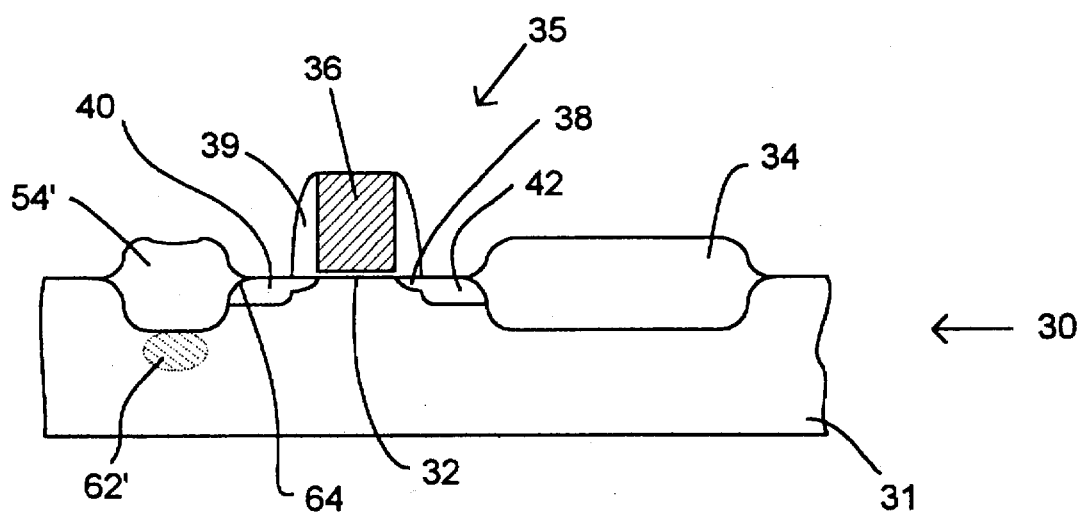

Conventional processing is performed to finish forming the MOS device structures illustrated in FIG. 9. Generally, the pad oxide layer 33 is removed and a new thermal oxide layer 32 is grown on the surface of the substrate. A polysilicon layer is deposited, doped and patterned to form gate electrode 36. A light implantation is made to form lightly doped source/drain regions 38 self-aligned to the gate. Insulating spacers 39 are formed on either side of the gate electrode 36 and a heavier implantation is performed to form heavily doped source and drain regions 40 and 42 so that the source and drain regions 40 and 42 are self-aligned to the spacers 39 and the field oxide regions 34 and 54'. Conventional processing continues to complete the device, with the deposition of a layer of BPSG, contact formation, metallization and passivation to connect the transistor 35 to other devices.

While this invention has been described in terms of the above specific embodiments, those skilled in the art will recognize that the invention can be practiced with modifications without departing from the scope of the invention.

What is claimed:

1. A method of forming a semiconductor device comprising the steps of:
   forming a field oxide masking layer over a semiconductor substrate and patterning the masking layer with field oxide openings therethrough to form a field oxide mask;
   forming field oxide regions upon an upper surface of the semiconductor substrate including at least one short field oxide region and a plurality of long field oxide regions;
   forming a channel stop mask with a channel stop opening therethrough over a central region of the short field oxide region;
   etching a trench in the short field oxide region through the channel stop opening in the channel stop mask, wherein the channel stop mask covers the long field oxide regions during the step of etching a trench in the short field oxide region;
   ion implanting dopant material through a bottom of the trench to form a channel stop in the substrate below the trench; stripping the channel stop mask from the substrate; and forming a semiconductor device on or within the substrate.

2. The method of claim 1, further comprising the step of:
   forming a pad oxide layer on the upper surface of the substrate prior to the step of forming a field oxide masking layer, wherein the step of the forming field oxide regions is begun with the pad oxide layer exposed in the field oxide openings in the field oxide masking layer.

3. The method of claim 1, wherein the trench is etched so as to leave a layer of trench oxide covering the substrate on the bottom of the trench.

4. The method of claim 3, wherein the trench oxide is less than approximately 1000 Å thick.

5. The method of claim 4, wherein the trench oxide is approximately 500 Å thick.

6. The method of claim 1, further comprising the steps, subsequent to the step of stripping the channel mask, of forming a planarizing layer comprising silicon oxide over the device and etching the planarizing layer to form a planarized surface above the trench.

7. The method of claim 6, wherein the field oxide masking layer acts as an etch stop for the step of etching the planarizing layer.

8. The method of claim 7, wherein the step of etching the planarizing layer is performed by chemical mechanical polishing.

9. The method of claim 1, wherein the dopant comprises boron implanted to a dose of between about $5\times10^{14}$ atoms/$cm^2$ and about $5\times10^{15}$ atoms/$cm^2$ at an energy of between about 50 KeV and 150 KeV and wherein the semiconductor device formed is an N-channel MOSFET.

10. The method of claim 1, wherein the dopant comprises arsenic or phosphorus implanted to a dose of between about $5\times10^{14}$ atoms/$cm^2$ and about $5\times10^{15}$ atoms/$cm^2$ at an energy of between about 50 KeV and 150 KeV and wherein the semiconductor device formed is a P-channel MOSFET.

11. A method of forming a semiconductor device comprising the steps of:
    forming a field oxide masking layer over a semiconductor substrate and patterning the masking layer with field oxide openings therethrough to form a field oxide mask;
    forming field oxide regions upon an upper surface of the semiconductor substrate including at least one short field oxide region;
    forming a channel stop mask with a channel stop opening therethrough over a central region of the short field oxide region, wherein the channel stop mask comprises polysilicon spacers formed within the field oxide mask openings and above a thin portion of the short field oxide region;
    etching a trench in the short field oxide region through the channel stop opening in the channel stop mask;
    ion implanting dopant material through a bottom of the trench to form a channel stop in the substrate below the trench;
    stripping the channel stop mask from the substrate; and forming a semiconductor device on or within the substrate.

12. The method of claim 11, wherein the polysilicon spacers are formed by:
    depositing a layer of polysilicon over the channel stop mask so that the layer of polysilicon is in contact with the short field oxide region within a corresponding opening of the field oxide mask; and
    etching back the layer of polysilicon to form the polysilicon spacers using a reactive ion etching process.

13. The method of claim 12, wherein the layer of polysilicon is deposited to a thickness of approximately 1000 Å.

14. The method of claim 12, wherein the channel stop mask comprises photoresist.

15. A method of forming a semiconductor device comprising the steps of:
    forming a field oxide masking layer over a semiconductor substrate and patterning the masking layer with field oxide openings therethrough to form a field oxide mask;
    forming field oxide regions upon an upper surface of the semiconductor substrate including at least one short field oxide region;
    forming a photoresist channel stop mask with a channel stop opening therethrough over a central region of the short field oxide region, wherein the channel stop mask comprises spacers formed above a peripheral portion of the short field oxide region;
    etching a trench in the short field oxide region through the channel stop opening in the channel stop mask;
    ion implanting dopant material through a bottom of the trench to form a channel stop in the substrate below the trench;
    stripping the channel stop mask from the substrate; and forming a semiconductor device on or within the substrate.

16. The method of claim 15, wherein the spacers are formed by:
    depositing a layer of spacer material over the channel stop mask so that the layer of spacer material is in contact with the short field oxide region within a corresponding opening of the channel stop mask; and
    etching back the layer of spacer material to form the spacers using a reactive ion etching process.

17. The method of claim 16, wherein the layer of spacer material is polysilicon deposited to a thickness of approximately 1000 Å.

18. The method of claim 1, wherein the step of forming field oxide regions forms a plurality of long field oxide regions and wherein the channel stop mask covers the long field oxide regions during the step of etching a trench in the short field oxide region.

19. The method of claim 1, wherein the semiconductor device is a MOSFET having first and second source/drain regions formed in the substrate, wherein the first source/drain region borders on the short field oxide region and wherein the second source/drain region borders on one of the long field oxide regions.

* * * * *